(12) United States Patent
Englekirk

(10) Patent No.: US 11,888,468 B2
(45) Date of Patent: Jan. 30, 2024

(54) TUNING CAPACITANCE TO ENHANCE FET STACK VOLTAGE WITHSTAND

(71) Applicant: pSemi Corporation, San Diego, CA (US)

(72) Inventor: Robert Mark Englekirk, Littleton, CO (US)

(73) Assignee: pSemi Corporation, San Diego, CA (US)

(*) Notice: Subject to any disclaimer, the term of this patent is extended or adjusted under 35 U.S.C. 154(b) by 504 days.

(21) Appl. No.: 17/190,122

(22) Filed: Mar. 2, 2021

(65) Prior Publication Data

US 2021/0258009 A1 Aug. 19, 2021

Related U.S. Application Data

(60) Continuation of application No. 16/813,459, filed on Mar. 9, 2020, now Pat. No. 10,951,210, which is a
(Continued)

(51) Int. Cl.
*H03K 17/687* (2006.01)
*H03K 17/10* (2006.01)
(Continued)

(52) U.S. Cl.
CPC ......... *H03K 17/6871* (2013.01); *H01H 11/00* (2013.01); *H03K 17/102* (2013.01);
(Continued)

(58) Field of Classification Search
CPC .................................................. H03K 17/6871
(Continued)

(56) References Cited

U.S. PATENT DOCUMENTS 4,306,203 A 12/1981 Sasaki et al.
4,564,843 A 1/1986 Cooper
(Continued)

FOREIGN PATENT DOCUMENTS

EP 2140494 6/2017
EP 2760136 5/2018
(Continued)

OTHER PUBLICATIONS

Theunissen, Lars, Communication under Rule 71(3) EPC received from the EPO dated Oct. 2, 2017 for appln. No. 14165804.7, 94 pgs.
(Continued)

*Primary Examiner* — Tomi Skibinski
(74) *Attorney, Agent, or Firm* — JAQUEZ LAND GREENHAUS & McFARLAND LLP; Alessandro Steinfl, Esq.

(57) ABSTRACT

An RF switch to controllably withstand an applied RF voltage Vsw, or a method of fabricating such a switch, which includes a string of series-connected constituent FETs with a node of the string between each pair of adjacent FETs. The method includes controlling capacitances between different nodes of the string to effectively tune the string capacitively, which will reduce the variance in the RF switch voltage distributed across each constituent FET, thereby enhancing switch breakdown voltage. Capacitances are controlled, for example, by disposing capacitive features between nodes of the string, and/or by varying design parameters of different constituent FETs. For each node, a sum of products of each significant capacitor by a proportion of Vsw appearing across it may be controlled to approximately zero.

20 Claims, 4 Drawing Sheets

Related U.S. Application Data division of application No. 15/829,773, filed on Dec. 1, 2017, now Pat. No. 10,622,992, which is a continuation of application No. 15/061,909, filed on Mar. 4, 2016, now Pat. No. 9,866,212, which is a continuation of application No. 14/883,122, filed on Oct. 14, 2015, now Pat. No. 9,595,956, which is a continuation of application No. 14/028,357, filed on Sep. 16, 2013, now Pat. No. 9,177,737, which is a continuation of application No. 13/046,560, filed on Mar. 11, 2011, now Pat. No. 8,536,636, which is a division of application No. 11/796,522, filed on Apr. 26, 2007, now Pat. No. 7,960,772.

(51) Int. Cl.
  *H03K 17/693* (2006.01)
  *H03K 17/16* (2006.01)
  *H01H 11/00* (2006.01)
  *H03K 17/06* (2006.01)

(52) U.S. Cl.
  CPC .......... *H03K 17/161* (2013.01); *H03K 17/693* (2013.01); *H03K 2017/066* (2013.01); *Y10T 29/49105* (2015.01)

(58) Field of Classification Search
  USPC ......................................................... 327/382
  See application file for complete search history.

(56) References Cited

U.S. PATENT DOCUMENTS

| | | | |
|---|---|---|---|
| 4,701,732 A | 10/1987 | Nestlerode | |
| 4,893,070 A | 1/1990 | Milberger et al. | |
| 4,924,238 A | 5/1990 | Ploussios | |
| 5,012,123 A | 4/1991 | Ayasli et al. | |
| 5,332,997 A | 7/1994 | Dingwall et al. | |
| 5,812,066 A | 9/1998 | Terk | |
| 5,818,099 A | 10/1998 | Burghartz | |
| 5,872,489 A | 2/1999 | Chang et al. | |
| 5,880,921 A | 3/1999 | Tham et al. | |
| 6,163,238 A | 12/2000 | Nesterode | |
| 6,265,925 B1 | 7/2001 | Wing | |
| 6,356,135 B1 | 3/2002 | Rastegar | |
| 6,611,164 B2 | 8/2003 | Uno | |
| 6,683,499 B2 | 1/2004 | Lautzenhiser et al. | |
| 6,747,522 B2 | 6/2004 | Peitruszynski et al. | |
| 6,753,738 B1 | 6/2004 | Baird | |
| 6,804,502 B2 | 10/2004 | Burgener et al. | |
| 6,870,404 B1 | 3/2005 | Maangat | |
| 6,889,036 B2 | 5/2005 | Ballweber et al. | |
| 6,906,653 B2 | 6/2005 | Uno | |
| 6,927,722 B2 | 8/2005 | Hong | |
| 6,992,543 B2 | 1/2006 | Luetzelschwab et al. | |
| 7,190,933 B2 | 3/2007 | De Ruijter | |
| 7,299,018 B2 | 11/2007 | Van Rumpt | |
| 7,310,215 B2 | 12/2007 | Pasternak | |
| 7,463,085 B2 | 12/2008 | Kim et al. | |
| 7,714,676 B2 | 5/2010 | McKinzie | |
| 7,764,140 B2 | 7/2010 | Nagarkatti et al. | |
| 7,772,648 B1 | 8/2010 | Ivanov et al. | |
| 7,825,715 B1 | 11/2010 | Greenberg | |
| 7,847,642 B2 | 12/2010 | Pretl | |
| 7,960,772 B2 | 6/2011 | Englekirk | |
| 8,138,816 B2 | 3/2012 | Freeston et al. | |
| 8,536,636 B2 | 9/2013 | Englekirk | |
| 8,583,065 B2 | 11/2013 | Ben-Bassat | |
| 8,583,111 B2 | 11/2013 | Burgener et al. | |
| 8,604,864 B2 | 12/2013 | Ranta et al. | |
| 8,638,159 B2 | 1/2014 | Ranta et al. | |
| 8,669,804 B2 | 3/2014 | Ranta et al. | |
| 8,803,631 B2 | 8/2014 | Manssen et al. | |
| 8,847,666 B2 | 9/2014 | Chih-Sheng | |
| 9,024,700 B2 | 5/2015 | Ranta | |
| 9,087,899 B2 | 7/2015 | Brindle et al. | |
| 9,106,227 B2 | 8/2015 | Ranta et al. | |
| 9,177,737 B2 | 11/2015 | Englekirk | |
| 9,197,194 B2 | 11/2015 | Reedy et al. | |
| 9,225,378 B2 | 12/2015 | Burgener et al. | |
| 9,293,262 B2 | 3/2016 | Bawell et al. | |
| 9,496,849 B2 | 11/2016 | Ranta et al. | |
| 9,595,956 B2 | 3/2017 | Englekirk | |
| 9,667,227 B2 | 5/2017 | Ranta | |
| 9,806,694 B2 | 10/2017 | Reedy et al. | |
| 9,866,212 B2 | 1/2018 | Englekirk | |
| 10,050,616 B2 | 8/2018 | Ranta et al. | |
| 10,158,345 B2 | 12/2018 | Reedy et al. | |
| 10,382,031 B2 | 8/2019 | Ranta | |
| 10,622,992 B2 | 4/2020 | Englekirk | |
| 10,951,210 B2 | 3/2021 | Englekirk | |
| 2003/0090313 A1 | 5/2003 | Burgener | |
| 2005/0017789 A1 | 1/2005 | Burgener et al. | |
| 2005/0068103 A1 | 3/2005 | Dupuis et al. | |
| 2005/0285684 A1 | 12/2005 | Burgener et al. | |
| 2005/0287976 A1 | 12/2005 | Burgener et al. | |
| 2006/0009164 A1* | 1/2006 | Kataoka | H04B 1/525 455/78 |
| 2006/0077082 A1 | 4/2006 | Shanks et al. | |
| 2006/0160520 A1 | 7/2006 | Naoyuki | |
| 2006/0194567 A1 | 8/2006 | Kelly et al. | |
| 2006/0255852 A1 | 11/2006 | O'Donnell | |
| 2006/0270367 A1 | 11/2006 | Burgener et al. | |
| 2007/0018247 A1 | 1/2007 | Brindle et al. | |
| 2007/0076454 A1 | 4/2007 | Burstein et al. | |
| 2008/0265978 A1 | 10/2008 | Englekirk | |
| 2009/0039970 A1 | 2/2009 | Shen et al. | |
| 2009/0134949 A1 | 5/2009 | He | |
| 2009/0224843 A1 | 9/2009 | Radoias et al. | |
| 2010/0219997 A1 | 9/2010 | Le Guillou | |
| 2011/0001542 A1 | 1/2011 | Ranta | |
| 2011/0001544 A1 | 1/2011 | Ranta | |
| 2011/0002080 A1 | 1/2011 | Ranta | |
| 2011/0043271 A1 | 2/2011 | Ranta | |
| 2011/0227666 A1 | 9/2011 | Manssen | |
| 2011/0316636 A1 | 12/2011 | Zhao | |
| 2014/0165385 A1 | 6/2014 | Englekirk | |
| 2014/0179374 A1 | 6/2014 | Burgener et al. | |
| 2016/0191019 A1 | 6/2016 | Reedy et al. | |
| 2016/0191050 A1 | 6/2016 | Englekirk | |
| 2017/0026035 A1 | 1/2017 | Englekirk | |
| 2018/0097509 A1 | 4/2018 | Reedy et al. | |
| 2018/0159530 A1 | 6/2018 | Englekirk | |
| 2019/0007042 A1 | 1/2019 | Ranta et al. | |
| 2019/0123735 A1 | 4/2019 | Reedy et al. | |
| 2020/0014382 A1 | 1/2020 | Ranta | |
| 2020/0280312 A1 | 9/2020 | Englekirk | |
| 2020/0295750 A1 | 9/2020 | Ranta et al. | |
| 2021/0099169 A1 | 4/2021 | Reedy et al. | |

FOREIGN PATENT DOCUMENTS

| | | |
|---|---|---|
| EP | 3346611 | 7/2018 |
| GB | 2425401 | 10/2006 |
| JP | 5860857 | 12/2015 |
| WO | 2007008044 | 1/2007 |

OTHER PUBLICATIONS

Puentes, Daniel Calrissian, Office Action received from the USPTO dated Nov. 22, 2017 for U.S. Appl. No. 15/442,491, 19 pgs.
Dang, Hung Q., Office Action received from the USPTO dated Oct. 14, 2016 for U.S. Appl. No. 14/638,917, 19 pgs.
Patel, Reema, Notice of Allowance received from the USPTO dated Nov. 2, 2016 for U.S. Appl. No. 14/883,122, 14 pgs.
Ranta, et al., Response filed in the USPTO dated Nov. 7, 2016 for U.S. Appl. No. 14/814,404, 8 pgs.
Reedy, et al., Response filed in the USPTO dated Sep. 29, 2016 for U.S. Appl. No. 14/883,512, 16 pgs.
Reedy, et al., Response to Final Office filed in the USPTO dated Jun. 15, 2017 for U.S. Appl. No. 14/883,512, 15 pgs.

(56) References Cited

OTHER PUBLICATIONS

Willoughby, Terrence Ronique, Notice of Allowance received from the USPTO dated Jul. 26, 2017 for U.S. Appl. No. 14/883,512, 5 pgs.
Peregrine Semiconductor Corporation, Response filed in the USPTO dated Apr. 11, 2016 for U.S. Appl. No. 14/165,422, 5 pgs.
Puentes, Daniel Calrissian, Office Action received from the USPTO dated May 10, 2016 for U.S. Appl. No. 14/814,404, 8 pgs.
Patel, Reema, Office Action received from the USPTO dated Jun. 22, 2016 for U.S. Appl. No. 14/883, 122, 8 pgs.
Le, Dinh Thanh, Notice of Allowance received from the USPTO dated Jun. 29, 2016 for U.S. Appl. No. 14/165,422, 24 pgs.
Willoughby, Terrence Ronique, Office Action received from the USPTO dated Jun. 29, 2016 for U.S. Appl. No. 14/883,512, 10 pgs.
Patel, Reema, Office Action received from the USPTO dated Aug. 15, 2014 for U.S. Appl. No. 14/028,357, 8 pgs.
Patel, Reema, Final Office Action received from the USPTO dated Apr. 7, 2015 for U.S. Appl. No. 14/028,357, 159 pgs.
Patel, Reema, Notice of Allowance received from the USPTO dated Jun. 25, 2015 for U.S. Appl. No. 14/028,357, 12 pgs.
Englekrik, Robert Mark, Response filed in the USPTO dated Dec. 15, 2014 for U.S. Appl. No. 14/028,357, 10 pgs.
Englekrik, Robert Mark, Response After Final Office Action filed in the USPTO dated Jun. 8, 2015 U.S. Appl. No. 14/028,357, 3 pgs.
Willoughby, Terrence Roniquie, Final Office Action received from the USPTO dated May 19, 2017 for U.S. Appl. No. 14/883,512, 38 pgs.
Brosa, Anna-Maria, Communication pursuant to Article 94(3) EPC received from the EPO dated Mar. 20, 2017 for appln. No. 14165804. 7, 6 pgs.
Puentes, Daniel Calrissian, Notice of Allowance received from the USPTO dated May 3, 2017 for U.S. Appl. No. 14/814,404, 29 pgs.
Meulemans, et al., Communication under Rule 71(3) EPC received from the EPO dated Dec. 13, 2016 for appln. No. 07794407.2, 33 pgs.
Meulemans, et al., Communication under Rule 71(3) EPC received from the EPO dated Dec. 13, 2016 for appln. No. 09174085.2, 30 pgs.
Ranta, Tero Tapio, Response filed in the USPTO dated Jan. 16, 2017 for U.S. Appl. No. 14/638,917, 12 pgs.
Puentes, Daniel Calrissian, Office Action received from the USPTO dated Feb. 1, 2017 for U.S. Appl. No. 14/814,404, 13 pgs.
Dang, Hung, Notice of Allowance received from the USPTO dated Feb. 13, 2017 for U.S. Appl. No. 14/638,917, 13 pgs.
Ranta, et al., Response filed in the USPTO dated Feb. 24, 2017 for U.S. Appl. No. 14/814,404, 4 pgs.
Tadashige, Itoh, et al., Office Action and English translation received from the JPO dated Feb. 7, 2017 for appln. No. 2015-225020, 10 pgs.
Ichikawa, Takenori, Office Action and English translation received from the JPO dated Aug. 1, 2015 for appln. No. 2013-181032, 15 pgs.
Ranta, et al., Response filed in the USPTO dated Nov. 6, 2015 for U.S. Appl. No. 14/165,422, 2 pgs.
Wong, Alan, Notice of Allowance received from the USPTO dated Dec. 18, 2015 for U.S. Appl. No. 13/586,738, 21 pgs.
Le, Dinh Thanh, Office Action received from the USPTO dated Jan. 11, 2016 for U.S. Appl. No. 14/165,422, 47 pgs.
Ranta, Tero Tapio, Preliminary Amendment filed in the USPTO dated Jul. 8, 2015 for U.S. Appl. No. 14/638,917, 8 pgs.
Wong, Alan, Notice of Allowance received from the USPTO dated Aug. 17, 2015 for U.S. Appl. No. 13/595,893, 12 pgs.
Peregrine Semiconductor Corporation, Response filed in the EPO dated Sep. 10, 2015 for appln. No. 14165804.7, 14 pgs.
Le, Dinh Thanh, Office Action received from the USPTO dated Sep. 22, 2015 for U.S. Appl. No. 14/165,422, 4 pgs.
Bawell, et al., Comments on Examiner's Statement of Reasons for Allowance filed in the USPTO dated Feb. 23, 2015 for U.S. Appl. No. 13/586,738, 3 pgs.

Wong, Alan, Final Office Action received from the USPTO dated Mar. 4, 2015 for U.S. Appl. No. 13/595,893, 33 pgs.
Puentes, Daniel, Notice of Allowance received from the USPTO dated Mar. 31, 2015 for U.S. Appl. No. 14/178,116, 181 pgs.
Henderson, Richard, Summons to Attend Oral Proceedings pursuant to Rule 115(1) received from the EPO dated Jun. 30, 2020 for appln. No. 18157696.8, 11 pgs.
Patel, Reema, Office Action received from the USPTO dated Mar. 14, 2017 for U.S. Appl. No. 15/061,909, 7 pgs.
Patel, Reema, Office Action received from the USPTO dated Jul. 3, 2017 for U.S. Appl. No. 15/061,909, 39 pgs.
Patel, Reema, Notice of Allowance received from the USPTO dated Sep. 20, 2017 for U.S. Appl. No. 15/061,909, 17 pgs.
Englekirk, Robert Mark, Response filed in the USPTO dated Mar. 24, 2017 for U.S. Appl. No. 15/061,909, 3 pgs.
Englekirk, Robert Mark, Response fied in the USPTO dated Aug. 7, 2017 for U.S. Appl. No. 15/061,909, 11 pgs.
Ranta, et al., Response filed in the USPTO dated Jan. 23, 2018 for U.S. Appl. No. 15/442,491, 8 pgs.
Puentes, Daniel Calrissian, Final Office Action received from the USPTO dated Feb. 8, 2018 for U.S. Appl. No. 15/442,491, 22 pgs.
Willoughby, Terrence Ronique, Office Action received from the USPTO dated Apr. 6, 2018 U.S. Appl. No. 15/688,658, 24 pgs.
Brosa, Anna-Maria, Extended Search Report received from the EPO dated Apr. 18, 2018 for appln. No. 18157696.8, 14 pgs.
Kelly, et al., "The State-of-the-Art of Silicon-on-Sapphire CMOS RF Switches" CSIC 2005 Digest, pp. 200-203 (4 pgs).
Puentes, Daniel Calrissian, Notice of Allowance received from the USPTO dated May 23, 2018 for U.S. Appl. No. 15/442,491, 9 pgs.
Patel, Reema, Office Action received from the USPTO dated Dec. 14, 2018 for U.S. Appl. No. 15/829,773, 5 pgs.
Patel, Reema, Office Action received from the USPTO dated May 1, 2019 for U.S. Appl. No. 15/829,773, 40 pgs.
Patel, Reema, Notice of Allowance received from the USPTO dated Aug. 14, 2019 for U.S. Appl. No. 15/829,773, 12 pgs.
Patel, Reema, Notice of Allowance received from the USPTO dated Nov. 29, 2019 for U.S. Appl. No. 15/829,773, 13 pgs.
Patel, Reema, Response to Rule 312 Communication received from the USPTO dated Feb. 13, 2020 for U.S. Appl. No. 15/829,773, 3 pgs.
Willoughby, Terrence Ronique, Notice of Allowance received from the USPTO dated Jul. 20, 2018 for U.S. Appl. No. 15/688,658, 11 pgs.
Itoh, et al., English translation of Office Action received from the JPO dated Aug. 28, 2018 for appln. No. 2017-102495, 2 pgs.
Rhaman, Hafizur, Office Action received from the USPTO dated Nov. 19, 2018 for U.S. Appl. No. 15/279,302, 82 pgs.
Puentes, Daniel Calrissian, Office Action received from the USPTO dated Dec. 18, 2018 for U.S. Appl. No. 16/025,922, 20 pgs.
Puentes, Daniel Calrissian, Final Office Action received from the USPTO dated Apr. 10, 2019 for U.S. Appl. No. 16/025,922, 14 pgs.
Puentes, Danil Calrissian, Applicant-Initiated Interview Summary received from the USPTO dated Apr. 29, 2019 for U.S. Appl. No. 16/025,922, 3 pgs.
Puentes, Danil Calrissian, Advisory Action received from the USPTO dated Jun. 24, 2019 for U.S. Appl. No. 16/025,922, 6 pgs.
Puentes, Danil Calrissian, Notice of Allowance received from the USPTO dated Aug. 19, 2019 for U.S. Appl. No. 16/025,922, 13 pgs.
Willoughby, Terrence Ronique, Office Action received from the USPTO dated Oct. 11, 2019 for U.S. Appl. No. 16/156,930, 33 pgs.
Brosa, Anna-Maria, Office Action received from the EPO dated Dec. 11, 2019 for appln. No. 18157696.8, 8 pgs.
Nguyen, Hai L., Notice of Allowance received from the USPTO dated Dec. 27, 2019 for U.S. Appl. No. 16/025,922, 12 pgs.
Englekirk, Robert Mark, Preliminary Amendment filed in the USPTO dated Feb. 23, 2018 for U.S. Appl. No. 15/829,773, 6 pgs.
PSemi Corporation, Response filed in the USPTO dated Jan. 15, 2019 for U.S. Appl. No. 15/829,773, 6 pgs.
PSemi Corporation, Response filed in the USPTO dated Aug. 1, 2019 for U.S. Appl. No. 15/829,773, 7 pgs.
PSemi Corporation, Amendment After Allowance filed in the USPTO dated Jan. 9, 2020 for U.S. Appl. No. 15/829,773, 6 pgs.

(56) References Cited

OTHER PUBLICATIONS

Willoughby, Terrence Ronique, Final Office Action received from the USPTO dated Jun. 24, 2020 for U.S. Appl. No. 16/156,930, 30 pgs.
Patel, Reema, Office Action received from the USPTO dated Jul. 21, 2020 for U.S. Appl. No. 16/813,459, 18 pgs.
Patel, Reema, Notice of Allowance received from the USPTO dated Nov. 12, 2020 for U.S. Appl. No. 16/813,459, 170 pgs.
Nguyen, Hai L., Notice of Allowance received from the USPTO dated Mar. 24, 2021 for U.S. Appl. No. 16/837,758, 7 pgs.
Rahman, Hafizur, Final Office Action received from the USPTO dated May 26, 2021 for U.S. Appl. No. 16/524,710, 10 pgs.

* cited by examiner

TUNING CAPACITANCE TO ENHANCE FET STACK VOLTAGE WITHSTAND

CROSS-REFERENCE TO RELATED APPLICATIONS—CLAIMS OF PRIORITY

This application is a continuation application of co-pending and commonly assigned U.S. application Ser. No. 16/813,459, "Tuning Capacitance to Enhance FET Stack Voltage Withstand", filed March 9, 202; application Ser. No. 16/813,459 is a divisional application of commonly assigned U.S. application Ser. No. 15/829,773, "Tuning Capacitance to Enhance FET Stack Voltage Withstand", filed Dec. 1, 2017, now U.S. Pat. No. 10,622,992 issued Apr. 14, 2020; application Ser. No. 15/829,773 is a continuation application of commonly assigned U.S. application Ser. No. 15/061,909, "Tuning Capacitance to Enhance FET Stack Voltage Withstand", filed Mar. 4, 2016, now U.S. Pat. No. 9,866,212, issued Jan. 9, 2018; application Ser. No. 15/061,909 is a continuation application of commonly assigned U.S. application Ser. No. 14/883,122, "Tuning Capacitance to Enhance FET Stack Voltage Withstand", filed Oct. 14, 2015, now U.S. Pat. No. 9,595,956 issued Mar. 14, 2017; application Ser. No. 14/883,122 is a continuation application of commonly assigned U.S. application Ser. No. 14/028,357, "Tuning Capacitance to Enhance FET Stack Voltage Withstand", filed Sep. 16, 2013, now U.S. Pat. No. 9,177,737 issued Nov. 3, 2015, which is a continuation application of commonly assigned U.S. application Ser. No. 13/046,560, "Tuning Capacitance to Enhance FET Stack Voltage Withstand", filed Mar. 11, 2011, Issued as U.S. Pat. No. 8,536,636 on Sep. 17, 2013, which is a divisional application of issued and commonly owned U.S. application Ser. No. 11/796,522, filed Apr. 26, 2007, issued Jun. 14, 2011 as U.S. Pat. No. 7,960,772 and entitled "Tuning Capacitance to Enhance FET Stack Voltage Withstand", and the contents of the above cited pending application and issued patents are hereby incorporated by reference herein in their entirety.

BACKGROUND

1. Field

The present disclosure relates to electronic integrated circuits ("ICs"), and more specifically to circuits comprised of stacked transistor devices for switching high frequency signals.

2. Related Art

Most radios, cell phones, TVS, and related equipment today require an "RF switch" to control connections between various transmitter and receiver circuits ("RF" is used generically herein to mean any reasonably high frequency ac signal). FIG. 1 is a simplified schematic diagram of a typical, simple two throw switch that may by used to switch, for example, a single antenna 102 between a transmit signal source 104 and a receive circuit 106. Switches $S_1$ 108, $S_2$ 110, $S_3$ 112 and $S_4$ 114 are represented by a mechanical single pole single throw switch symbol. Typically, the switches are controlled such that when $S_1$ is "closed" or conducting at low impedance, $S_2$ is "open" or high impedance. Because no switch is perfect, the node of a transmit/receive switch (such as $S_1$ 108 or $S_2$ 110) farthest from the antenna is typically shunted to circuit common to reduce the effects of signal leakage through such switch when it is open. Thus, as $S_2$ 110 is illustrated in the "open" state, the corresponding shunt switch $S_4$ 114 is "closed" to terminate the Receive $S_{RF}$ signal on node 106 to ground 116. Conversely, the shunt switch $S_3$ 112 is "open" condition because its corresponding signal switch $S_1$ 108 is "closed" to conduct the Transmit $S_{RF}$ signal on node 104 to the antenna 102. To couple the antenna 102 to the receive circuit, the condition of all four switches would typically be inverted to that shown in FIG. 1.

In modern circuits, RF switches such as represented in FIG. 1 are most often implemented using semiconductor devices, typically some form of field effect transistor (FET). Semiconductor RF switches are commonly fabricated using insulated gate FETs, often generically called MOSFETs despite the fact that many do not employ the original metal/oxide/semiconductor construction that gave rise to that acronym. Non-insulating gate FETs, such as junction FETs (JFETs), are also commonly used, particularly with certain semiconductor materials such as GaAs. Each switch may be implemented using a single FET, or, as described herein, a multiplicity of FETs stacked in series.

The impedance of ON (conducting) switches is generally sufficiently low that the voltage developed across it in this condition is negligible. However, switches that are OFF (nonconducting, or high impedance) must typically support the full voltage of the RF signal they control. Thus, the RF power that can be controlled by a semiconductor RF switch depends on its voltage withstand capacity, which in turn depends on the drain-to-source breakdown voltage (BVds) of its constituent transistor(s). In FIG. 1, both $S_2$ 110 and $S_3$ 112 must withstand the transmit signal voltage $S_{RF}$ with respect to ground.

Integrated circuit fabrication requires many compromises. In particular, many IC transistors that are otherwise highly effective for switching RF signals have a modest BVds, and thus may be inadequate to control signals of substantial amplitude. One solution may be to employ alternative transistor designs yielding higher BVds. However, the tradeoffs necessary to fabricate transistors with higher BVds in an integrated circuit may be burdensome. For example, such design may be incompatible with other circuitry desired for the integrated circuit, or it may otherwise be uneconomical.

Therefore, many semiconductor RF switches today stack a multiplicity of low BVds transistors in series to improve the breakdown performance of the overall switch. FIG. 2 represents an example of such a stacked-transistor semiconductor switch. The switch is disposed between a first node $N_1$ 202 and a second node $N_2$ 204, and is controlled by a voltage $V_{Control}$ 206. To form the overall switch, a multiplicity j of FETs are "stacked" in series connection, from drain to adjacent source. Thus, a first transistor $M_1$ has a source coupled to $N_1$ 202, and a drain coupled directly to the source of a second FET $M_2$ 210. Additional FETs, represented by a series of dots, may be similarly connected above $M_2$ 210, the drain of the last such intervening FET being coupled to the source of the top or $j^{th}$ FET of the stack, FET $M_j$ 212. Each FET of the stack is controlled by $V_{Control}$ as coupled to the FET's gate via a corresponding gate impedance, such as the base resistances $RB_1$ 214, $RB_1$ 216, . . . , $RB_j$ 218 that are illustrated.

Though the FET channel terminal closer to $N_1$ is referred to as the "source," and the opposite terminal as the "drain," this is not a requirement. FETs may be implemented in a wide variety of designs and polarities (e.g., N channel FETs and P channel FETs; enhancement and depletion modes, and various threshold voltages, etc.). Moreover, the circuits in which transistors are employed may be illustrated using different conventions than are followed herein. Transistor polarity and drain-source orientation may often be interchanged without significantly altering the principle of operation of a circuit. Rather than illustrate the numerous possible permutations of drawing conventions, transistor polarities, and transistor designs, it should be well understood by those skilled in the electronics arts that the exemplary description and figures illustrated herein equally represent all such alternative circuit descriptions and equivalent device designs.

For most RF switch purposes, base impedances (represented in FIG. 2 as resistors $RB_x$ 214, 216, 218) should combine with the effective corresponding gate capacitance of the FET to form a low-pass filter whose transfer function has at least a single pole roll-off at a frequency that is less than ⅙ the lowest (expected) design frequency for the signal that will exist between $N_1$ and $N_2$. Indeed, the at least one pole frequency is preferably 1/10 such lowest design signal frequency, or even lower. Such low frequency base control permits the gate voltage of each FET to follow the voltage on the channel of the FET, thus assuring the correct "on" or "off" gate/source voltage (Vgs), and also limiting both Vgs and the drain/gate voltage (Vdg) to prevent breakdown of the gate insulation.

Ideally, stacked device switches such as shown in FIG. 2 have a net voltage withstand capacity equal to BVds of the individual FETs, multiplied by the number (j) of FETs in the stack. Thus, a stack of 10 transistors each having BVds of 1.8 V would ideally be capable of switching a signal having a peak amplitude of 18 V. In practice, unfortunately, such stacks may be unable to support such ideal voltage. The voltage withstand capacity can be increased by increasing the number of devices in the stack, but this may cause large increases in the corresponding required integrated circuit area.

For example, assume that BVds for a given fabrication process is 2V (i.e., each single transistor can handle 2V), but that a 16V signal must be controlled. A stack of eight transistors should ideally be able to control a signal of peak amplitude 16V. If eight transistors prove insufficient for this task in practice, then more transistors must be added to support the required voltage. Unfortunately, the series resistance of the stack is the sum of the individual device resistances. Consequently, as the number of stacked devices increases by a factor S, so does the ON resistance of the switch. Therefore, to maintain the required overall ON resistance (or insertion loss), the impedance of each device must be reduced by the factor S. This, in turn, requires that the area of each such device is increased by the factor S. Given S additional FETs, each with an area increased by S, it is clear that the total area of the FETs in the stack will increase as $S^2$. At some point, the switch area can be immense. Moreover, the parasitic capacitances of these transistors typically increase with the area, and this can lead to numerous additional problems.

Thus, there is clearly a need to identify and solve the problem that prevents some stacked FETs from controlling the ideal voltage, i.e., the number of FETs times the BVds of the individual FETs. Embodiments of devices and methods of manufacturing such devices are described herein that can mitigate or eliminate the noted problem, thus enabling stacked transistors to withstand voltages that approach, or even equal, the theoretical maximum for a given BVds of the constituent transistors.

SUMMARY

Research into observed failures of some stacked transistor RF switches at lower than expected applied switch voltages (Vsw) led to a conclusion that small parasitic capacitances (Cpd), previously thought negligible, were unexpectedly causing significant imbalances in the distribution of Vsw across the individual transistors of the stack. To reduce the distribution imbalances, capacitance to internal stack nodes is added or intentionally modified, in contrast to the previous practice of merely making drain-source capacitances (Cds) uniform for the series-connected (stacked) transistors.

One embodiment is a stacked transistor RF switch comprising a multiplicity of constituent transistors (e.g., FETs) of the stack all coupled in series connection drain to source to form a series string for which internal nodes are those between adjacent transistors. This embodiment includes effective drain-source capacitance Cds that is significantly different for one transistor than for another transistor of the stack. Their relative Cds values may differ by an amount of at least 2%, 5%, or 10%, or by at least 0.5% between each of a majority of pairs of constituent transistors, and/or so as to effectively tune capacitances of the stack. Tuning is effective if a variance of the magnitude of Vds-off as distributed across all constituent transistors increases when the Cds values are made substantially more equal. An embodiment may include a discrete capacitive element coupled to an internal node of the series string, and/or may include transistors having different Cds values due to design differences, and may have different Cds between a majority of pairs of transistors of the stack.

Another embodiment is also a stacked transistor RF switch comprising a multiplicity of constituent transistors (e.g., FETs) of the stack all coupled in series connection drain to source to form a series string for which internal nodes are those between adjacent transistors. This embodiment includes a discrete physical capacitor element Ccomp that effectively tunes capacitances of the transistor stack by being coupled to an internal node of the series string. Tuning is effective if a variance of the magnitude of Vds-off as distributed across all constituent transistors increases when all Ccomp capacitor elements are removed. Ccomp capacitors may be fabricated as metal-insulator-metal (MIM) capacitors, or may be any other distinct physical feature having an impedance that is predominantly capacitive at the frequency (a primary frequency) of a signal ordinarily switched by the RF switch.

A further embodiment is a method of fabricating an RF switch comprising a multiplicity of series connected constituent transistors in a series string for which internal nodes are those between each pair of adjacent transistors, and includes a step of establishing significantly different values for total effective drain-source capacitance Cds of different transistors in the stack. Significantly different values may be those varying by at least 2%, 5%, or 10%, or by at least 0.5% between each of a majority of pairs of constituent transistors, and/or may be such as to effectively tune capacitances of the stack. Tuning is effective if a variance of Vds-off as distributed across all constituent transistors due to a voltage Vsw applied across the RF switch would increase if the effective drain-source capacitances were substantially more equal. The method may include an additional step of determining parasitic drain capacitances, other than drain-source capacitances, coupled to internal nodes in the series string, and may include a further step of determining voltages of nodes to which the parasitic drain capacitances are coupled as compared to voltages on endnodes of the RF switch. The method may include a further capacitance balancing step of establishing values of the capacitances coupled to a particular internal node of the series string of stacked transistors and multiplying each such capacitance value by a number reflecting a proportion of Vsw appearing across the capacitance in operation to voltage-weight the capacitance, such that a sum of such voltage-weighted capacitances is approximately zero for the particular node. The method may further include thus balancing a node between each of a majority of adjacent transistor pairs, or even thus balancing a node between each adjacent transistor pair of the stack.

A yet further embodiment is a method of fabricating an RF switch comprising a multiplicity of series connected constituent transistors in a series string for which internal nodes are those between each pair of adjacent transistors, and includes a step of coupling a discrete capacitive feature, or alternatively at least two discrete capacitive features, to one or more internal nodes of the stack. A discrete capacitive feature is a distinct element having an impedance that is predominantly capacitive at the frequency of a signal that is ordinarily switched by the RF switch, and the added capacitive feature(s) may be required to effectively tune capacitances of the stack, such that a variance of magnitude in Vds-off as distributed across all constituent transistors due to an RF switch voltage Vsw applied across the RF switch increases when all such discrete capacitive features are omitted. The method may include an additional step of determining parasitic drain capacitances Cpd that are coupled to an internal node in the series string, and also may include determining voltages of nodes to which the parasitic drain capacitances are coupled as compared to voltages on endnodes of the RF switch. The step of determining parasitic drain capacitances may include analyzing semiconductor device layout geometric parameters including parameters descriptive of interconnection traces. The method may include a capacitance balancing step of weighting each value of the capacitances coupled to a particular internal node of the series string of stacked transistors according to a number reflecting a proportion of Vsw appearing across the capacitance in operation, such that a sum of such weighted capacitance values is approximately zero for the particular node. The method may further include performing the balancing step for each of a majority of the internal nodes of the series string, or for all of the internal nodes of the series string.

BRIEF DESCRIPTION OF THE DRAWINGS

Embodiments of the present invention will be more readily understood by reference to the following figures, in which like reference numbers and designations indicate like elements.

DETAILED DESCRIPTION

Figure 2:
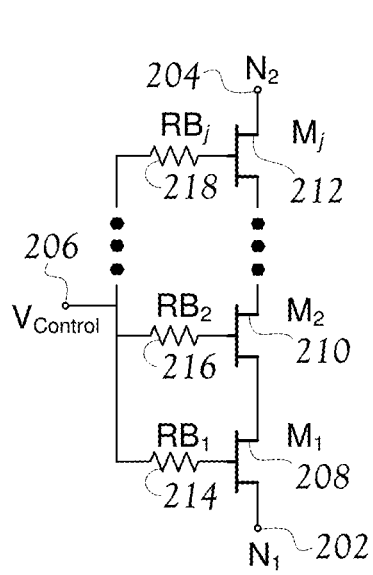
FIG. 2 illustrates a basic FET stack designed to function as an RF switch device.
Figure 3:
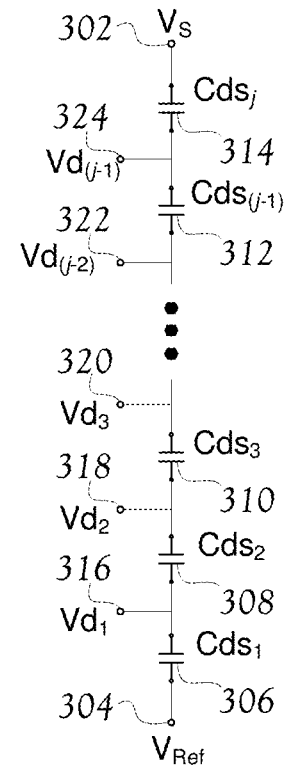
FIG. 3 illustrates voltage division across j stacked FETs in an RF switch that is "off."

The background set forth above describes a typical stacked RF switch, as illustrated in FIG. 2. FIG. 3 illustrates how a switch such as shown in FIG. 2 should divide an applied RF voltage, such as ($V_S$ 302-$V_{Ref}$ 304) such that equal voltages are imposed on each of the j FETs in the stack. When the switch is off (and presuming $V_{Ref}$ is zero), $V_S$ 302 is applied to the endnodes 302-304 of the stack. Though each FET is in a high impedance state, the switch conducts somewhat due to the effective drain-source capacitances Cds corresponding to each $FET_x$. Because the "off" conduction is almost entirely due to these capacitances, the FET structure itself is not shown, but only the j corresponding effective drain-source capacitances $Cds_1$ 306, $Cds_2$ 308, $Cds_3$ 310, . . . , $Cds_{(j-1)}$ 312 and $Cds_j$ 314. This capacitive divider distributes the impressed voltage $V_S$ across each corresponding drain node to produce $Vd_1$ 316, $Vd_2$ 318, $Vd_3$ 320, . . . , $Vd_{(j-2)}$ 322 and $Vd_{(j-1)}$ 324.

If each Cds has the same value, it appears that $V_S$ should divide uniformly across the FETs such that $Vd_1$ (all voltages with respect to $V_{Ref}$) is $V_S/j$, $Vd_2$ is $2*V_S/j$, and so on, with $Vd_{(j-1)}=(j-1)V_S/j$. Because of this expected result, stacked FET devices have previously been fabricated to establish Cds for each FET at substantially the same value. Other parasitic capacitances in such FET stacks are generally quite small relative to Cds, and moreover typically do not directly divide the impressed voltage. Accordingly, the effects of such other parasitic capacitances have been largely ignored in regard to voltage division across the FETs in stacked-FET RF switches.

The series coupling of transistors to form a stacked switch as represented, for example, in FIG. 2 forms a path for conduction when the switch is "on." In that "on" condition, the conduction path couples together the endnodes ($N_1$ 202 on the "bottom" and $N_2$ 204 on the "top") via the channels of all of the constituent FETs $M_1$ 208 to $M_j$ 212. Only nodes along such conduction path will be referred to herein as "series nodes" or "nodes of the series string" of a transistor stack or stacked switch. Typically, most of the series string nodes are either a drain or a source of a constituent FET, which are so closely coupled that all such nodes may be called "drain nodes." However, other elements may be disposed in the series string of a transistor stack, and if so may have nodes that are on the conduction path, and that are therefore also "series nodes" or "nodes of the series string."

Voltage Distribution Inequality Due to Parasitic Drain Capacitances

After examination of a problem of unexpectedly low voltage breakdown for stacked-FET RF switches, the Applicant determined that voltage distribution across the FETs in such stack was not uniform. Therefore one FET generally experienced a larger proportion of the total applied switch voltage than any other FET in the stack. That most heavily stressed FET failed first, leading to failure of the other FETs in a domino-like effect. Upon further investigation, the Applicant determined that the voltage distribution inequalities are often caused by parasitic capacitances that are small compared to the drain-source capacitances, and hence have been previously overlooked.

As noted above, drain parasitic capacitance (Cpd) values are generally not more than a few percent of the corresponding drain-source capacitance Cds. As such, Cpd has often been ignored when calculating the expected voltage distribution. Even small values of Cpd, however, may have large effects on the voltage distribution, depending upon the node to which such Cpd is coupled. A Cpd coupling a drain to a node Np that experiences some combination of the signals at the RF switch endnodes may inject such signals into the drain, changing the distribution of voltages across the FETs of the stack from the ideal equality to something less desirable. That is, if the node Np experiences a signal that comprises $(A*V_1+B*V_2)$, where A and B are possibly complex or even time-varying multipliers, $V_1$ is the voltage at one end of the "open" RF switch, and $V_2$ is the voltage at the other end of the open RF switch, then a signal will be injected into the corresponding drain that distorts the distribution of $(V_2-V_1)$ across the FETs. Any Cpd that couples to such an Np (a node having a significant component of $(A*V_1+B*V_2)$) may be relevant to net voltage distribution. When the signal on such Np differs greatly from the "ideal" drain voltage, the signal injection and resulting voltage distribution inequality can be quite substantial, even if Cpd is small, due to the large voltage across it. This effect is described in more detail below with reference to FIG. 4.

Not all integrated circuit technologies have been equally successful in enhancing RF switch breakdown voltage by stacking devices in series. In some technologies, Cpd may be quite obviously significant in comparison with a corresponding Cds, and hence would not be overlooked. However, the problem has also not been recognized or resolved with these technologies, possibly because the performance has been so bad that the issue has not been pursued. Indeed, the very large parasitic components might possibly be an important reason that stacked switch designs have not been pursued using some integrated circuit technologies.

Special case: parasitic drain capacitances Cpd are predominantly disposed between a corresponding drain and ground. In a special case, each significant $Cpd_n$, for $1 \Leftarrow n \Leftarrow (j-1)$, is coupled to a common voltage $V_{COM}$ (e.g., ground) to which one end of the corresponding RF switch is connected. Stated differently, each $Np_n$ experiences essentially the same signal as does one end of the RF switch, typically $V_{COM}$ or ground. This special case is addressed first for two reasons: first, it approximates many practical switches; and second, it is conceptually simple.

Figure 1:
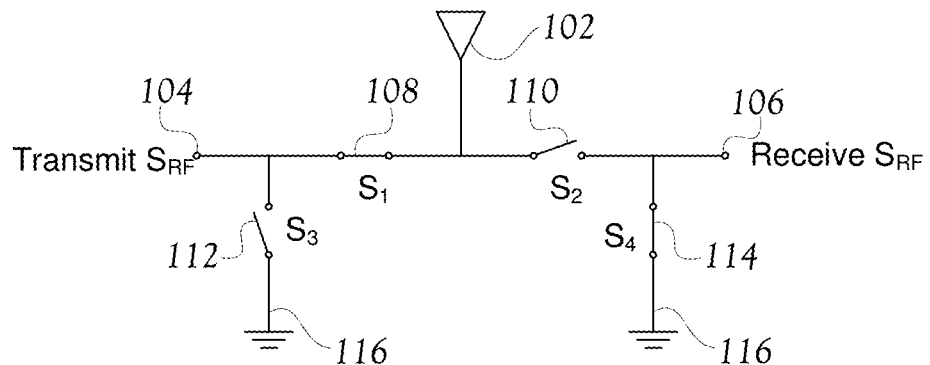
FIG. 1 is a simplified schematic diagram of a simple transmit/receive RF switch.

An RF switch is often disposed between an RF signal node and a ground or circuit common node. This is the situation, for example, for RF switch $S_3$ 112 of the transmit/receive antenna switch circuit illustrated in FIG. 1. As shown in FIG. 1, the transmit RF signal Transmit $S_{RF}$ 104 is imposed on one side of $S_3$ 112, while the other side of the switch $S_3$ is connected to ground 116. It is also not unusual for parasitic drain capacitances Cpd to be predominantly coupled to a ground plane. For example, Cpd may predominantly consist of parasitic capacitances to a substrate, and such substrate may be held at ground potential (at least for RF purposes). At least when both of these conditions exist, the special case arises in which each relevant Cpd is coupled to the signal at one end of the RF switch. In such special case, the Cpd of each FET will have an effect on the (off) RF switch voltage distribution that is roughly proportional to the value of such Cpd multiplied by the number n of the FET, where n=1 for the FET whose source is coupled to $V_{COM}$ or ground, such that n indicates how many FETs are connected in series between the drain of $FET_n$ and $V_{COM}$ or ground.

Figure 4:
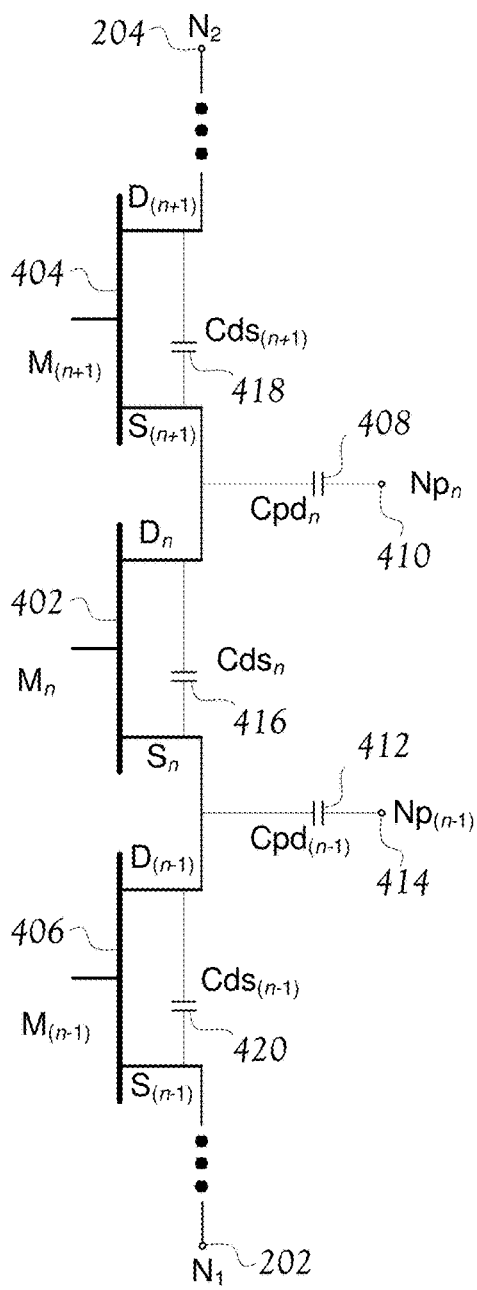
FIG. 4 illustrates effective parasitic drain capacitances Cpd for FETs in a stack such as illustrated in FIG. 2.

FIG. 4 illustrates three FETs 402, 404 and 406 within a stack of j FETs that are disposed between a first node $N_1$ 202 and a second node $N_2$ 204. For purposes of understanding the special case, it is temporarily assumed that $N_1$ 202 is ground, and that $Np_n$ 410 and $Np_{(n-1)}$ 414 are also coupled to ground for at least RF signals. It is also presumed that the ideal voltage on $D_n$ (the drain of the center FET $M_n$ 402) is $(n/j)V_{N2}$. Such ideal voltage distribution obtains in the RF switch reflected by FIG. 4 if, for example, all values Cds are equal, and all values of Cpd are truly negligible. It is also momentarily assumed that all values of Cds are indeed equal, and further that all values of $Cpd_x$, for x unequal to n, are truly negligible.

Figure 5:
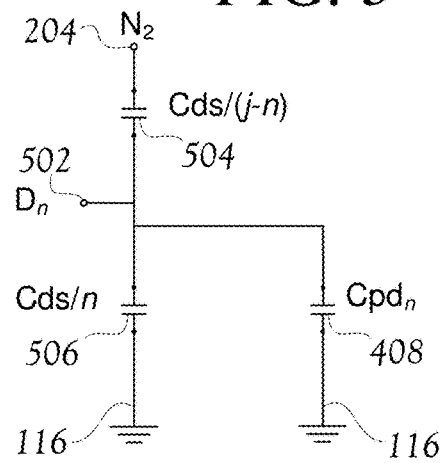
FIG. 5 is an equivalent circuit illustrating effects of a parasitic drain capacitance Cpd.

The effect of $Cpd_n$ 408 on the signal present on the drain $D_n$ 502 of $FET_n$ may then be analyzed with reference to FIG. 5, which is an equivalent circuit for FIG. 4 that reflects the conditions and assumptions noted above. The equal-valued Cds capacitances for the (j−n) FETs above FET $M_n$ are equivalent to a capacitor 504 having a value of Cds/(j−n). Similarly, the Cds for the lowest n FETs are equivalent to a capacitor 506 having a value Cds/n. As noted above, Cpd values have conventionally been ignored because they are generally not more than about 2% of the values of Cds. Consideration of FIG. 5 reveals, however, that the effect of $Cpd_n$ is much greater than suggested by its size in proportion to Cds, at least when n approaches j for large stacks. For example, let j=16, n=15, and $Cpd_n$=2% of Cds. Though $Cpd_n$ is only 2% as large as Cds, it is 30% as large as the equivalent capacitor (capacitor 506) that is parallel to $Cpd_n$; as such, $Cpd_n$ is clearly not negligible. In fact, the resulting voltage at $D_n$ 502 becomes $(0.9202)N_2$, rather than the ideal value (were $Cpd_n$ not present) of $(15/16)N_2$ or $(0.9375)N_2$. Just a single $Cpd_{15}$, having a value only 2% that of Cds, thus causes the drain-source voltage across $M_{16}$ to be (1.276/16) $N_2$ rather than $(1/16)N_2$, which is a 27.6% increase in $Vds_{16}$. Moreover, the effect is greatly increased when each $D_n$ has a corresponding $Cpd_n$ to ground, as illustrated in FIG. 7.

Figure 7:
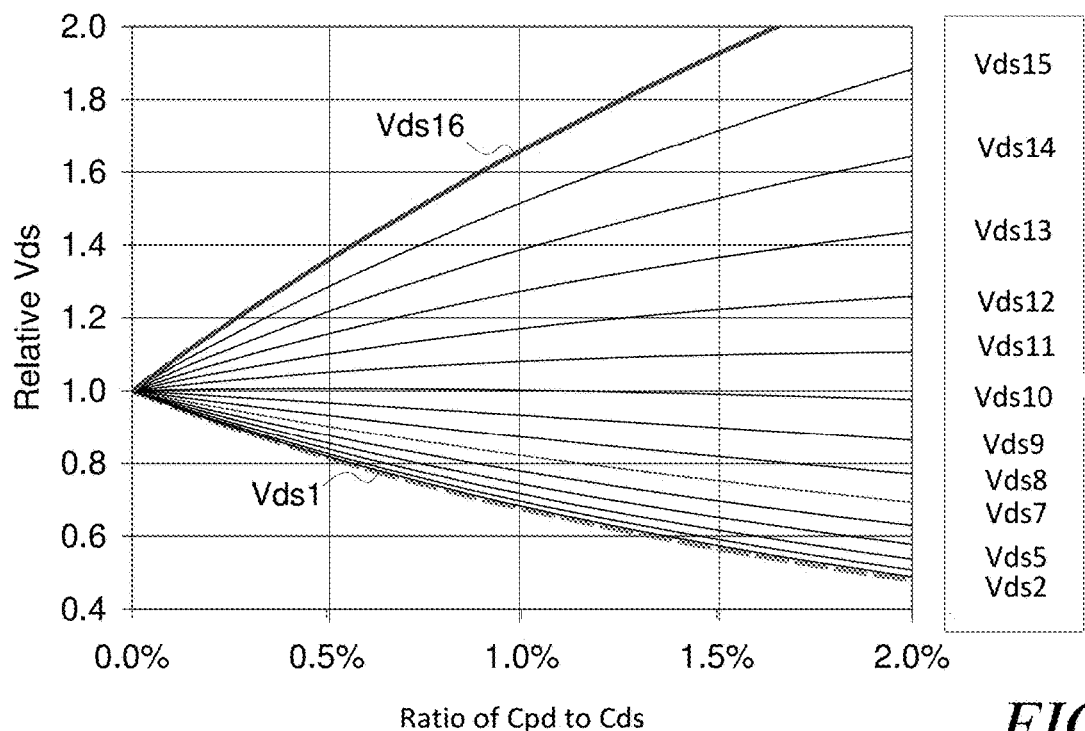
FIG. 7 is a graph illustrating the relative Vds of each of the transistors in a stack of 16 transistors as a function of a ratio of Cpd to Cds values.

FIG. 7 is a graph showing the relative distribution of the drain-source voltage Vdsn for each of the FETs (n=1 to 16) in a stacked RF switch, as a function of the size of Cpd with respect to Cds. Relative Vds is the Vds for each $FET_n$, compared to the voltage of $N_2/j$. Because j is 16 in this example, Relative Vds is the Vds of the particular FET compared to $1/16$ of the RF switch voltage. A curve is provided for each of the 16 FETs in the stack, which are labeled on the right side of the graph as space permits.

As expected from consideration of FIG. 5, FIG. 7 shows that the disparity between the ideal expected voltage across each $FET_n$ is most pronounced at the ends of the stack, i.e., for n=1 and for n=16; and the magnitude of the $Vds_n$ increases for higher values of n. Indeed, $FET_{16}$ experiences a relative voltage 200% larger than the ideal value (Relative Vds=2) when each Cpd is just 1.6% as large as Cds. The assumptions for this figure are that each Cds has the same value, each Cpd has the same proportional value of Cds, and each Cpd is coupled to a node that is the RF signal equivalent to the voltage at the source connection of FET $M_1$, e.g., ground.

Figure 8:
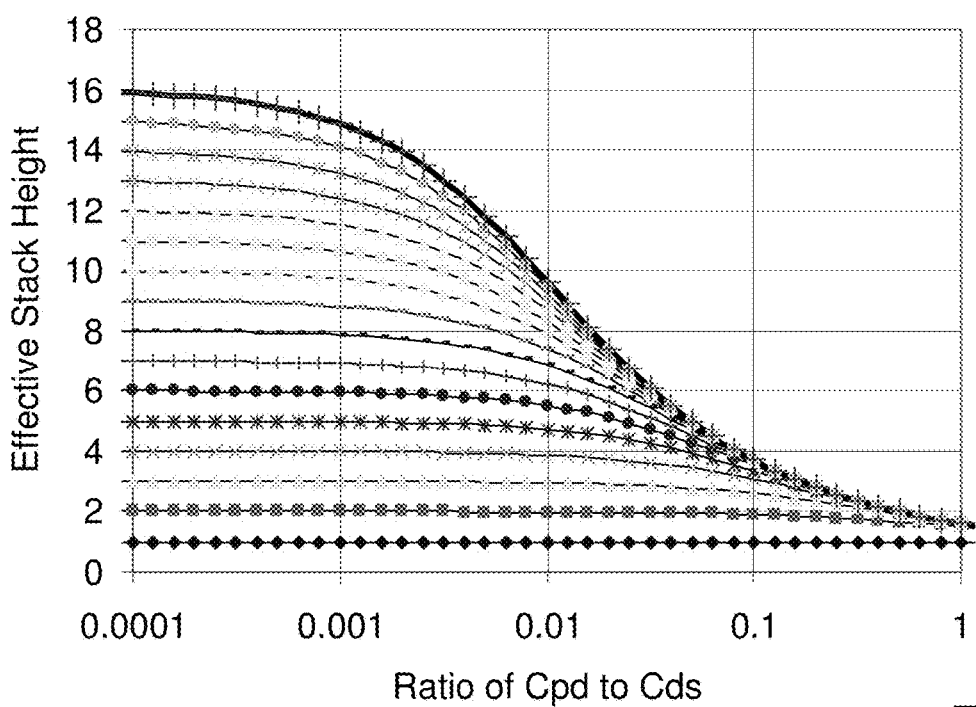
FIG. 8 is a graph illustrating the effective number of transistors in transistor stacks having 2 to 16 transistors, as a function of a ratio of Cpd to Cds values.

FIG. 8 also reflects the effect of uncompensated Cpd capacitances as a function of the ratio of Cpd to Cds. The Effective Stack Height is the actual withstand voltage of the RF switch in units of BVds, which is assumed the same for each stack transistor. The Effective Stack Height for stacks of j FETs are shown for actual stack heights j=1 (no stack at all) to 16 transistors. When the drain parasitic capacitances Cpd are very small (0001, or 0.01% as large) compared to the drain-source capacitances Cds, the stack operates nearly ideally, with a withstand voltage of j multiplied by the BVds of each FET. Thus, when the Cpd/Cds ratio=0.0001, a stack of 13 FETs (j=13) behaves essentially like an ideal stack of 13 devices, and hence it begins at an effective stack height of 13. Each other trace similarly begins at an Effective Stack Height value equal to the actual stack height of the switch, so the traces need no labeling. As the ratio of Cpd/Cds increases, the effective stack height decreases, because uncompensated Cpd values cause unequal distribution of voltage over the FETs of the stack, decreasing most rapidly for the largest stack (j=16). As the ratio of Cpd to Cds increases, the transistors no longer equally share the source voltage, and the top transistor in the stack, $M_1$, typically experiences significantly more voltage than any other transistor. When $M_1$ breaks down, the remaining transistors follow suit in a domino effect, so the effectiveness is limited by the voltage across $M_1$. For a stack of 16, the ideal breakdown voltage of the stack would be 16×BVds, but at a Cpd/Cds ratio of only 1.6% (0.016), it will fail at 8×BVds, thus having an effective stack height of 8.

For the special case, at least, it is thus clear that if Cpd values are not taken into account the stack is likely to fail at a much lower voltage than expected. The FET that is positioned furthest from the ground connection of an RF switch will most likely fail first, at a total RF switch voltage that may be a fraction of the ideal or expected peak voltage. Some solutions to this problem are set forth below for the special case, followed by a generalization of the problem and corresponding general solutions.

Solutions for the Special Case

Figure 6:
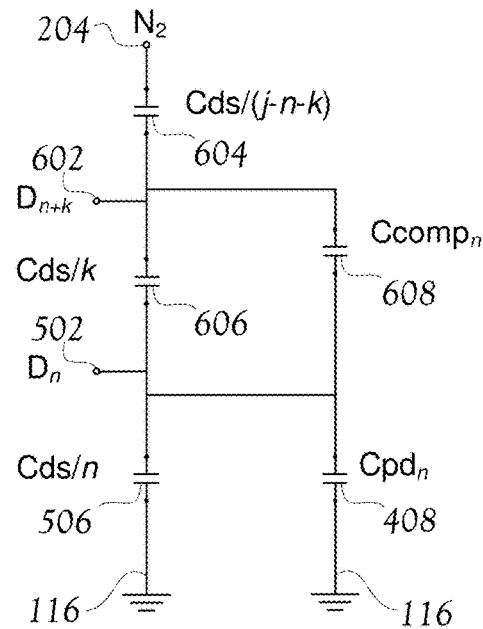
FIG. 6 is an equivalent circuit illustrating an addition of tuning capacitance between stack nodes to compensate Cpd in a circuit such as represented by FIG. 5.

FIG. 6 is an equivalent circuit similar to that of FIG. 5, and illustrates a set of solutions that differ from each other according to a value of k. To compensate or tune a node $D_n$ 502, a node $D_{(n+k)}$ 602 is selected based on factors such as ease of layout and effectiveness of the node 602. Nodes of higher k may be more effective, as described below. As an example, if j=16 and n=10, k may be set to any value from 1 to 6 (i.e., j−n). Selection of the node 602 results in a capacitor 604 composed of the series combination of those Cds that are above $D_{(n+k)}$ 602. Capacitor 604 therefore has a value of Cds/(j−n−k), for k<(j−n). When k=(j−n), of course, there is no capacitor 604 because $D_{(n+k)}$ 602 is tied directly to $N_2$ 204. As in FIG. 5, a capacitor 506 represents the series combination of the Cds of all FETs up to FET $M_n$ and hence has a value of Cds/n. The capacitor 506 is coupled, together with $Cpd_n$ 408, to ground 116. Tuning is achieved by adding a compensation capacitor $Ccomp_n$ 608 to compensate for the disruptive effects of $Cpd_n$ 408.

In one conceptually simple solution, k=(j−n) so that $D_{(n+k)}$ 602 is tied directly to $N_2$ 204. Perfect tuning of $D_n$ 502 is then readily achieved by making $Ccomp_n$ 608 equal to $Cpd_n*(n/k)$. This turns out to be the solution for any value of k. Such tuning is an iterative process, because the node $D_{(n+k)}$ 602 will need to be subsequently compensated due to the effect of $Ccomp_n$ 608. In this special case (Cpd components all effectively coupled to the source of $M_1$), solutions of the form illustrated in FIG. 6 are most readily implemented by first compensating the node $D_1$ ($Cdp_1$), and then proceeding to compensate each successive drain node.

It may be useful in some embodiments to let k=1, such that $Ccomp_n$ is simply disposed parallel to the channel of $M_{(n+1)}$. One advantage may be the relative simplicity of disposing $Ccomp_n$ between two nearby nodes. Another advantage may follow if the design of $M_{(n+1)}$ can be altered such that the inherent capacitance $Cds_{(n+1)}$ is significantly increased. Changes to the layout and design of the transistors $M_1$ to $M_j$ may reduce the size of the needed Ccomp capacitances, and may even obviate a need for some discrete Ccomp capacitances.

On the other hand, if k>1 (i.e., if Ccomp is coupled to a drain of a transistor higher in the stack), then the actual capacitance required for such Ccomp will generally be proportionally reduced as k increases. Note, however, that the breakdown voltage of such Ccomp must correspondingly increase. To implement the special case solution when k>1 requires discrete Ccomp capacitors to bridge a plurality of FETs. In the special case (i.e., when the various effective Cpd are predominantly coupled to a node equivalent to the end of the RF switch that is coupled to the lowest transistor $M_1$), a k>=1 solution may be implemented by disposing Ccomp capacitors between drain nodes $D_n$ and a drain $D_{(m>n)}$. Drain $D_{(m>n)}$ may, for example, be a node equivalent to the end of the RF switch to which $M_j$ is coupled.

The desirability of such coupling to drains of FETs that are more remote in the stack depends on the fabrication parameters and layout of the target RF switch. Factors tending to make such remote-node coupling desirable include: a) a layout that lends itself to such connection, especially if the Ccomp layout create no further undesirable parasitic capacitances; b) availability of a capacitor suitable for voltages greater than BVds; and c) a dearth of space available for such capacitors. Indeed, if the breakdown voltage BVc of a compensating capacitor is sufficiently high, it may be useful to couple the compensating capacitor to that endnode of the RF switch that is opposite the node to which the Cpd to be compensated is most closely coupled. The capacitance required for a compensation capacitor is proportional to 1/m, where m is the number of series FETs across which such compensation capacitor is coupled. This effect may permit compensation capacitors disposed across a plurality of FETs to occupy less die area, which is almost always beneficial.

The best tuning embodiment thus depends, among other things, on the accessibility of the various drain nodes, as well as on the suitability of capacitors that are compatible with the fabrication parameters, as well as on the space available for such capacitors and whether or not they can be fabricated atop other structures without adding die area. If tuning creates difficulties in layout, it may be desirable to compensate less than perfectly, permitting j to increase slightly.

A further tuning solution applies to the special case (in which each Cpd is coupled to ground or $N_1$), and in a basic form uses compensation capacitance only across single transistors (i.e., k=1). Conceptually, this further solution first compensates for $Cpd_1$ by increasing the effective $Cds_2$ by an amount equal to $Cpd_1$. Next it compensates for $Cpd_2$ by increasing the effective $Cds_3$ by an amount equal to $Cpd_2$, but increased by a factor of 2 (i.e., $2Cpd_2$) because $Cpd_2$ is coupled across two transistors, $M_1$ and $M_2$. Furthermore, $Cds_3$ must be increased over $Cds_2$, which has already been increased by the value of $Cpd_1$. All Cpd being equal, and all original Cds being equal, and for n>1, each effective Cds should be increased by an amount $Ccomp_n$ determined according to the following geometric progression:

$$Ccomp_n = \sum_{i=1}^{n-1} i \times Cpd_i \quad \text{(Eqn. 0)}$$

Though conceptually described as beginning with compensation of $Cpd_1$, note that the equation may be evaluated in any order. All compensations must be present at the time of fabrication, of course, and thus there can really be no "order" of compensation.

Compensation or tuning can rarely be absolutely precise, and the value of further precision certainly approaches zero for uncompensated Cpd values that are 0.01% of Cds or less.

Smaller stacks tolerate greater imprecision. In the case illustrated in FIG. 5, the single $Cpd_{15}$ that was presumed present resulted in a $Vds_{16}$ increased over the ideal value by only a factor of 1.28. Yet FIG. 7 suggests that the result for the same transistor, $M_{16}$, when each drain has a corresponding Cpd, would be that $Vds_{16}$ have approximately a factor of 2.2 greater than the ideal. Thus, while a single parasitic capacitance may not be negligible, it is unlikely to cause severe voltage distribution imbalances by itself. Therefore, errors in tuning any one particular node may be unimportant if most of the nodes are reasonably well tuned.

Moreover, even imprecise tuning may substantially raise the voltage withstand capacity of a stacked-transistor RF switch. For example, when the Cpd capacitances of a stacked-transistor RF switch design are predominantly coupled to a first endnode of an RF switch, improvements in switch voltage withstand may be realized by progressively increasing the net effective Cds for transistors that are progressively farther from the first endnode. Such general, progressive increase may be achieved, for example, by modifying transistor designs, and/or by adding discrete compensating capacitances. Such a general, imprecise solution may be as described in regard to FIG. 6, with k=1.

General Case Circuits and Solutions

In practice, parasitic capacitances from internal nodes can couple to any number of places. In a standard CMOS IC they may couple to the substrate. In SOI or GaAs devices they may couple to the package or metal on the back of the part. In all types of devices, the parasitic capacitances can also couple to nearby metal lines. Constituent Cpd capacitances coupled to any node having a signal comprising $X*V_{N1}-Y*V_{N2}$ may limit the RF handling capability of large stacks to less than j×BVds.

Not only the effective Cpd of a drain node, but also the effective Cds and/or the effective Ccomp may be comprised of a plurality of distinct constituent capacitances. The constituents of an effective Cpd capacitance may well be coupled to a multiplicity of different circuit nodes, as may constituents of Ccomp. Cds are coupled between particular nodes, but may still comprise a plurality of constituent capacitances. Consequently, the general case is far more complicated than the special case described above.

Figure 9:
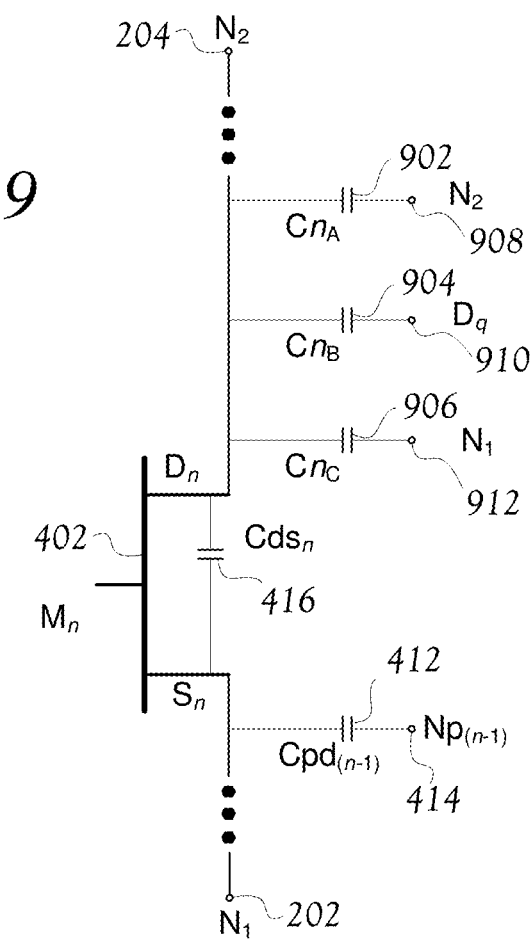
FIG. 9 schematically illustrates further capacitance details of circuits such as illustrated in FIG. 4.

FIG. 9 expands upon a portion of FIG. 4 to illustrate such greater complexity. FIG. 9 illustrates $M_n$ 402 of FIG. 4, together with $Cpd_{(n-1)}$ 412, which is coupled to the source node $S_n$ and to the corresponding terminal node $Np_{(n-1)}$ 414, and the two endnodes $N_1$ 202 and $N_2$ 204 of the RF switch. FIG. 9 illustrates an expansion of the effective $Cpd_n$ 408 of FIG. 4, or an expansion of an effective compensation capacitance Ccomp, or both. In the first case, $Cn_A$ 902, $Cn_B$ 904 and $Cn_C$ 906, which are terminated at nodes 908, 910 and 912 respectively, represent constituent capacitances of $Cpd_n$ 408. Node 908 is the RF equivalent of the second end of the RF switch, $N_2$ 204, while Node 912 is the RF equivalent of the first end of the RF switch, $N_1$ 202. Finally, node 910 is the RF equivalent of a different drain, $D_q$. $Cpd_n$ 408 represents the parallel combination of such constituent capacitances, so the total capacitance of $Cpd_n$ 408 will be the sum of the three values of $Cn_A$, $Cn_B$ and $Cn_C$, presuming there are no other significant Cpd constituents.

In this general case, the equivalent node $Np_n$ 410 of FIG. 4 may well not be an actual node. However, in any event, it is a mathematical equivalent node having an equivalent signal content based on the signal voltages of $N_2$, $N_1$, and on the relative magnitudes of $Cn_A$ 902, $Cn_B$ 904 and $Cn_C$ 906. It may be useful to determine whether the effective signal on the equivalent node $Np_n$ 410 is closer to the signal on $N_2$ or the signal on $N_1$. The relevant signal components of the (net effective) $Cpd_n$ will most often cause the signal to fall somewhere between the ideal voltage of $D_n$ and the voltage of $N_2$, or else between the ideal voltage of $D_n$ and the voltage of $N_1$. In the former case, $D_n$ is properly said to be more closely coupled to $N_2$ than to $N_1$, while in the latter case $D_n$ is properly said to be more closely coupled to $N_1$. With $M_1$ coupled to $N_1$ (as shown in FIG. 4), compensation of effective $Cpd_n$ that is more closely coupled to $N_1$ requires an increase in capacitance between $D_n$ and one or more nodes that are more closely coupled to $N_2$. The converse is also true: compensation of effective $Cpd_n$ that is more closely coupled to $N_2$ requires an increase in capacitance between $D_n$ and one or more nodes that are more closely coupled to $N_1$. For each drain node n, the effect of each constituent of Cpd may be calculated as described with respect to FIG. 6, and the effects of all such constituents combined to determine the effective $Cpd_n$.

In an alternative view of FIG. 9, the capacitances $Cn_A$ 902, $Cn_B$ 904 and $Cn_C$ 906, instead of exclusively representing constituents of a Cpd, represent constituents of both a Cpd and of a Ccomp. According to one example of this view, node 912 is $N_1$, and capacitor $Cn_C$ 906 comprises substantially all of $Cpd_n$. Node 910 ($D_q$) is the next higher drain, $D_{(n+1)}$ (i.e., q=n+1), and consequently the $Cn_B$ 904 represents an increase in effective drain-source capacitance $Cds_{(n+1)}$. $Cn_B$ 904 may, for example, be a discrete capacitor, or it may reflect an increase in Cds resulting from design modification of $M_{(n+1)}$. Further, it may reflect a combination of both means. Node 908 is an RF equivalent to $N_2$, so $Cn_A$ 902 may be a small discrete capacitor coupled between $D_n$ and $N_2$. Capacitances 902 and 904 are constituents of $Ccomp_n$. Values of the capacitances 902, 904 and 906, together with any disparity between $Cds_n$ and $Cds_{(n+1)}$ not encompassed by $Cn_B$ 904, should be established to satisfy Eqn. 1, as described below. Of course, Ccomp may have any number of constituent capacitances; and, as described above for determining the effective Cpd, the effect of each Ccomp constituent may be individually determined and then combined as the effective $Ccomp_n$.

A general rule for tuning or compensation of a node m, which is the drain of a stacked transistor, is set forth below. Each capacitance Cim is disposed between the node m and a different node i. Node m (in operation, with the RF switch in high impedance or off state) will have a voltage Vm, and under the same conditions each other node i will have a voltage Vi. P is the total number of distinct capacitors tied to node m. Based on calculation of charge injection to the node m, then, balance (and thus uniform voltage distribution) may be achieved by establishing that:

$$0 = \sum_{i=0}^{P-1}(Vi - Vm) \times Cim. \quad \text{(Eqn. 1)}$$

To the extent that Cds for the transistor immediately above node m and Cds for the transistor immediately below node m are equal, they may be ignored if the voltage is uniform on those two transistors, i.e., if [V(m+1)−V(m−1)]/2=Vm. However, if the Vds above and below node m are not going to be established to be equal in magnitude (and opposite in sign), then each Cds must be included in the calculation. Even if the Vds are equal, the Cds values should be included in the summation at least to the extent that they are significantly unequal.

Precision is helpful up to a point, but as noted above, precision is not always necessary to substantially improve voltage distribution imbalances across the transistors in a stacked RF switch. For some embodiments, it will suffice to observe that the Cpd are, on average, more closely coupled to $N_1$ than to $N_2$, and accordingly to establish values for Cds that are significantly increasing (e.g., increasing by more than 0.03%) for a majority of the FETs, rather than being substantially equal or varying randomly. Many embodiments of the devices and methods described herein achieve compensation for undesirable parasitic capacitances in a stacked FET RF switch by adding compensating capacitances coupled between nodes of transistors in the stack, particularly between drain nodes (or source nodes, which are equivalent). Such compensating capacitances may cause adjacent FETs in a stack to have significantly different net values of Cds, or may establish a compensating network of capacitance that is parallel to the series Cds string of the FET stack.

Adding Compensation Capacitance:

Cds is described as an effective drain-source capacitance, and herein means the total effective drain-source capacitance, net of intentional and unintentional capacitances and effects, unless a different meaning is made clear. Net effective Cds may be changed, for example, by simply coupling a predominantly capacitive feature between the drain and source nodes of a transistor in an RF switch stack. A predominantly capacitive feature is a passive element having an impedance at the frequency of a switched signal that is more capacitive than inductive or resistive. As circuit designers will understand, many structures may be fabricated that function as capacitors, and any such capacitor or predominantly capacitive feature or element may constitute a compensation capacitor or capacitance.

A compensation capacitance may include a difference between the intrinsic Cds of different constituent transistors of a stack, at least to the extent that such difference is an intentional result of specific design variations between such transistors. A particular constituent FET of a stack may have a different layout, or otherwise be designed or fabricated differently, from another constituent FET to achieve a desired difference in Cds values between such FETs. The manner in which Cds is achieved is not important to the devices and methods described herein; instead, any technique may be employed to establish satisfactory effective Cds values. Thus, any significant or intentional difference between the effective Cds of different transistors in a stack may fairly be considered to represent compensation capacitance.

When modifying individual transistor designs to vary their effective Cds is feasible, such modification may at least partly tune the capacitance of a transistor stack. Such modification may be very elegant. However, the required differences in design may be tedious to implement, and also may be relatively difficult to reestablish when a circuit must be modified for unrelated reasons. Nonetheless, such modification may provide some or even all of the compensation capacitance needed to satisfactorily tune the capacitances of a stacked transistor RF switch.

The simplest design modification for varying effective Cds is a simple change in device size. A larger device intrinsically has a larger value of Cds, so physically larger transistors may be used when larger Cds is required. Indeed, intrinsic Cds may well be substantially proportional to device size. In the special case in which Cpd capacitances are predominantly coupled to one endnode (the "bottom") of the RF switch, the transistors at the top of the stack require more compensation capacitance. In that case, the higher n transistors may be made progressively larger, either in lieu of, or in addition to, adding discrete capacitance between nodes of the series string of the stack.

The general idea of varying transistor size to at least partially supplant a need for discrete compensation capacitors applies to the general case of tuning stacked transistor switches. However, the following analysis particularly applies to the special case of a stack as described above and represented by FIG. 4, with the assumption made above for FIGS. 5 and 6 that each Cpd is coupled to a node equivalent to the lowest endnode ($N_1$, to which $M_1$ is coupled) of the RF switch. The width $W_n$ of each transistor $M_n$, n>1, may be determined as follows for the special case, with $W_1$ selected to establish overall switch resistance to satisfy performance requirements:

$$W_n = W_1 \prod_{i=1}^{j-1} \frac{Cds_i + i \times Cpd_i}{Cds_i} \quad \text{(Eqn. 2)}$$

Because Cds is generally a linear function with transistor width, while Cpd will typically be non-linear, eqn. 2 cannot readily be further simplified, nor made precise. Ideally, a stack tuned in accordance with Eqn. 2 will also satisfy the requirements of Eqn. 1, as set forth above.

Capacitances fabricated using gate insulation may be employed for tuning, though they may, for example, have a relatively low breakdown voltage, or be nonlinear. Moreover, because parasitic capacitance is often proportional to layout area, adding such compensating capacitors to the side of a transistor may create further parasitic capacitance. This may make tuning an iterative process, because the solution to the problem changes with each addition of compensation.

Metal-Metal (MIM) capacitance disposed on top of the switch transistor itself may be the best solution in some cases. Thus located, MIM capacitors may not require extra die area, and typically add no extra parasitic capacitance to ground, at least. Moreover, establishing a desired capacitance with a MIM capacitor is relatively simple, and consequently is likely to be easier to revise for subsequent design iterations, as compared to solutions based on modifying the transistor design. MIM capacitors may also have higher breakdown voltages, and thus may be amenable to being coupled between nodes m and i that are separated by a plurality of transistors (i.e., k>1 with respect to FIG. 6).

Identifying and Quantifying Effective Tuning

A voltage Vsw applied to an RF switch comprised of j constituent stacked transistors is distributed across the constituent transistors of the stack. Deviation from uniformity in the distribution may be quantified as the variance V of the portion of Vsw appearing on each transistor, where $Vds_i$ for each transistor $M_i$ resulting from Vsw is Vi, and $$V^2 = \left( \sum_{i=1}^{j} (Vi - Vsw/j)^2 \right) / j.$$

Useful tuning of a stacked transistor RF switch will result in a smaller variance V for the distributed voltages across the constituent transistors of the stack. Random process variation will inevitably cause small differences between the Cds of different transistors in a stack. However, because a design with no variation will be as perfect as possible, such random variations should generally act to increase the variance of the distributed transistor voltages. Accordingly, intentional tuning through control of Cds, on the one hand, and random, unintentional variations in the values of Cds on the other hand, may be distinguished by a showing of whether reducing the variation in Cds in a device or method (making the Cds of constituent transistors more uniform) would decrease or increase the variance in voltage distribution across the stack. The variance will increase as a result of reducing the Cds variations that serve to effectively tune a stacked switch.

Variance in voltage distribution across constituent transistors can similarly distinguish distribution tuning capacitance that is coupled to an internal node of the series string of a stacked-transistor switch. Upon omission of the predominantly capacitive elements coupled to internal nodes of the switch in an RF switch embodiment as described herein, the variance of the voltage distribution will increase if they are distribution tuning capacitances. Conversely, if capacitance has been coupled to internal string nodes for purposes other than tuning to increase voltage withstand capacity, then removing such capacitance will decrease the variance of voltage distribution.

Random process variation in Cds values can be distinguished from variations implemented intentionally to increase voltage withstand tuning by the magnitude of the maximum Cds variations. Thus, for the constituent transistors of a stack on a particular device, the largest Cds will be very close to the smallest Cds if the deviation is merely due to random process variations. For tuning a stack of j transistors, a size comparison (Cds(max)/Cds(min)−1) may be required to be at least j/200, or at least j/100, or at least j/50. Irrespective of j, a tuned stack of transistors may be required to have a Cds(max) that exceeds Cds(min) by at least 2%, at least 5%, or at least 10%, or at least 20%. Any of these limitations may be explicitly added to any claim of method, process or apparatus in order to distinguish incidental designs that are not intended to be encompassed by such claim.

Differences in net effective Cds values between adjacent pairs of transistors in a series stack may be required to be at least 0.5% for each of a majority of such adjacent pairs. Alternatively, differences in such net effective Cds values between adjacent pairs of transistors may be compared to a total Cpd (not including Cds constituents) for the internal node of the string that is between the transistors of such pair. The Cds differences may then be required to exceed the total Cpd for the node between them, for at least half, or for a majority, of such adjacent pairs. The calculation may also be made by averaging, such that a sum of Cds differences between all adjacent transistor pairs is required to exceed a sum of the total Cpd for the node(s) between such pairs.

Determining Cpd Values

The integrated circuit designer is often faced with a need to evaluate circuit parasitic elements, and any such technique may be employed to establish the parasitic drain capacitances Cpd to nodes other than the corresponding source, as well as the parasitic drain-source capacitance Cds. Complete circuit simulation based on the detailed parameters of the selected fabrication process and layout is ideal, if the simulation program is accurate and sufficient processing power is available to complete the task in a reasonable length of time. It is also possible to build a circuit, probe (measure) the distribution of the RF switch voltage across the individual transistors of the stack, and to deduce the effective Cpd values from such measurements. However, as noted above, a substantial improvement in RF switch voltage withstand capacity may be achieved even without perfect compensation. Accordingly, less demanding techniques may be employed to estimate Cpd values.

One example of such a technique to estimate parasitic capacitance from a node to substrate is as follows:

$$C = L\varepsilon\left\{\frac{w}{h} + 0.77 + 1.06 \times \left[\left(\frac{w}{h}\right)^{0.25} + \left(\frac{t}{h}\right)^{0.5}\right]\right\}, \quad \text{(Eqn. 3)}$$

where w and L are the width and length of the node, t is the thickness of the node, h is the height of the node above the ground plane, $\varepsilon = \varepsilon_o \times 8.854\text{e-}12$ F/m, and $\varepsilon_o$ is the relative permittivity of the substrate material.

Numerous computer programs exist to aid the designer in estimating parasitic circuit elements. Programs such as Medici, ADS/Momentum, FastCap, HFSS, and others are capable of 2D and 3D parasitic capacitance estimation. These tools enable more accurate estimation of capacitance to all other nodes in the vicinity of the node(s) being analyzed.

CONCLUSION

The foregoing description illustrates exemplary implementations, and novel features, of related methods of tuning or compensating the capacitances of stacked-transistor RF switches to alleviate low breakdown voltages for such switch that would otherwise result from imbalances in the distribution of the overall RF switch voltage across the transistors of the stack. It also describes implementations and novel features of integrated circuit stacked-transistor RF switches, apparatus that employ capacitive tuning or compensation features to improve net breakdown voltage compared to the absence of such features. The skilled person will understand that various omissions, substitutions, and changes in the form and details of the methods and apparatus illustrated may be made without departing from the scope of the invention. Because it is impractical to list all embodiments explicitly, it should be understood that each practical combination of the features set forth above (or conveyed by the figures) as suitable for embodiments of the apparatus or methods constitutes a distinct alternative embodiment of an apparatus or method. Moreover, each practical combination of equivalents of such apparatus or method alternatives also constitutes a distinct alternative embodiment of the subject apparatus or methods. Therefore, the scope of the presented invention should be determined only by reference to the appended claims, as they may be amended during pendency of the application, and is not to be limited by features illustrated in the foregoing description except insofar as such limitation is recited, or intentionally implicated, in an appended claim.

The transistors in stacked-transistor RF switches as described herein are preferably of an insulated-gate type, or are biased so as to conduct no DC gate current. Even more preferably, the transistors are FETs, particularly those referred to as MOSFETs, though that includes many FETs that are not fabricated with traditional Metal/Oxide/Semiconductor layers, as was once implied by the name. The FETs have been described as if they are of N polarity (NMOS), but they could equally well be PMOS. Embodiments may employ non-preferred transistors, though they may require circuit adjustments to deal with control-node DC current.

The circuits illustrated and described herein are only exemplary, and should be interpreted as equally describing such alternatives as may be readily seen to be analogous by a person of skill in the art, whether by present knowledge common to such skilled persons, or in the future in view of unforeseen but readily-applied alternatives then known to such skilled persons.

All variations coming within the meaning and range of equivalency of the various claim elements are embraced within the scope of the corresponding claim. Each claim set forth below is intended to encompass any system or method that differs only insubstantially from the literal language of such claim, but only if such system or method is not an embodiment of the prior art. To this end, each element described in each claim should be construed as broadly as possible, and should be understood to encompass any equivalent to such element insofar as possible without also encompassing the prior art.

What is claimed is:

1. A radio frequency (RF) switch comprising a stack of N series coupled transistors, N being an integer equal to 2 or more, wherein
   a first transistor of the N series coupled stacked transistors has a first width and a first length; and
   a second transistor of the N series of coupled stacked transistors has a second width smaller than the first width and a second length, wherein a difference between the first width and the second width is set at a predetermined amount.

2. The RF switch of claim 1, wherein the first transistor is above the second transistor in the stack.

3. The RF switch of claim 1, further comprising a first endnode at a first end transistor of the stack and a second endnode at a second end transistor of the stack, the first endnode configured to receive an RF voltage.

4. The RF switch of claim 3, wherein the first end transistor is a top transistor of the stack and the second end transistor is a bottom transistor of the stack.

5. The RF switch of claim 3, wherein the second endnode is connected to a reference voltage.

6. The RF switch of claim 5, wherein the reference voltage is ground.

7. The RF switch of claim 3, wherein the second endnode is connected to an input node or an output node.

8. The RF switch of claim 1, wherein the difference between the first width and the second width is set at the predetermined amount to balance voltage distribution within the stack of N series coupled transistors.

9. The RF switch of claim 1, wherein a third transistor of the series of coupled stacked transistors has a third width smaller than the second width, wherein a difference between the second width and the third width is set at a predetermined amount.

10. The RF switch of claim 9, wherein the third transistor is below the second transistor.

11. The RF switch of claim 9, wherein the predetermined amount is selected to reduce an area of the series of coupled stacked transistors.

12. The RF switch of claim 9, further comprising at least one transistor added to the stack of N series coupled transistors, thus forming a stack of at least N+1 series coupled transistors within an area of the stack of N series coupled transistors.

13. A radio frequency (RF) switch comprising a stack of series coupled transistors arranged between a first endnode and a second endnode from a first endnode transistor in the stack to a second endnode transistor in the stack, wherein
   a plurality of transistors of the stack have a width depending on a location of the plurality of transistors in the stack, and
   a width of a second transistor of the plurality of transistors is set at a predetermined amount to be smaller than a width of a first transistor of the plurality of transistors.

14. The RF switch of claim 13, wherein the plurality of transistors of the stack are an entirety of the transistors of the stack.

15. The RF switch of claim 13, wherein the first endnode transistor is connected to a reference voltage.

16. The RF switch of claim 15, wherein the reference voltage is ground.

17. The RF switch of claim 13, wherein the first endnode transistor is connected to an input or an output node.

18. The RF switch of claim 13, wherein the second endnode is connected to an input node or an output node.

19. A voltage distribution-balanced transistor arrangement for radio frequency (RF) operation, comprising:
   a stack of series coupled field emission (FET) transistors comprising a first transistor having a first width and a second transistor having a second width smaller than the first width by at least a predetermined amount to voltage balance the transistor arrangement.

20. The voltage distribution-balanced stack of claim 19, further comprising:
   a first endnode at a top of the stack of series coupled FET transistors;
   a second endnode at a bottom of the stack of series coupled FET transistors;
   a plurality of internal nodes between pairs of adjacent transistors of the stack of series coupled FET transistors; and
   at least one compensation capacitor coupled across: i) the first endnode and at least one node of the plurality of internal nodes, ii) at least two nodes of the plurality of internal nodes, iii) at least one node of the plurality of internal nodes and the second endnode, iv) the first endnode and the second endnode, or v) at least one of the plurality of internal nodes and ground.

* * * * *